(12) United States Patent
Liu et al.

(10) Patent No.: US 7,144,811 B2
(45) Date of Patent: Dec. 5, 2006

(54) METHOD OF FORMING A PROTECTIVE LAYER OVER CU FILLED SEMICONDUCTOR FEATURES

(75) Inventors: Chi-Wen Liu, Hsinchu (TW); Ying-Lang Wang, Tai-chung County (TW)

(73) Assignee: Taiwan Semiconductor Manufacturing Co. Ltd, Hsin-Chu (TW)

( * ) Notice: Subject to any disclaimer, the term of this patent is extended or adjusted under 35 U.S.C. 154(b) by 738 days.

(21) Appl. No.: 10/264,462

(22) Filed: Oct. 3, 2002

(65) Prior Publication Data

US 2004/0067643 A1    Apr. 8, 2004

(51) Int. Cl.
*H01L 21/44* (2006.01)
*H01L 21/4763* (2006.01)

(52) U.S. Cl. .................... 438/687; 438/643; 438/648; 438/678; 257/E21.584; 257/E21.586

(58) Field of Classification Search ............... 438/685, 438/627, 643, 653, 687, 692, 678
See application file for complete search history.

(56) References Cited

U.S. PATENT DOCUMENTS

| | | | | |
|---|---|---|---|---|
| 5,985,762 A | * | 11/1999 | Geffken et al. | ............. 438/687 |
| 6,114,238 A | * | 9/2000 | Liao | |
| 6,323,121 B1 | * | 11/2001 | Liu et al. | .................... 438/633 |
| 6,376,353 B1 | * | 4/2002 | Zhou et al. | |
| 6,417,093 B1 | * | 7/2002 | Xie et al. | |
| 2002/0096775 A1 | * | 7/2002 | Ning | |

* cited by examiner

*Primary Examiner*—Ha Tran Nguyen
(74) *Attorney, Agent, or Firm*—Tung & Associates

(57) ABSTRACT

A method of forming a protective layer over a metal filled semiconductor feature to prevent metal oxidation including providing a semiconductor process wafer comprising an insulating dielectric layer having an opening for forming a semiconductor feature; blanket depositing a metal layer over the opening to substantially fill the opening; and, blanket depositing a protective layer comprising at least one of a oxidation resistant metal and metal nitride over the metal layer.

5 Claims, 2 Drawing Sheets

METHOD OF FORMING A PROTECTIVE LAYER OVER CU FILLED SEMICONDUCTOR FEATURES

FIELD OF THE INVENTION

This invention generally relates to methods for forming copper filled semiconductor features and more particularly to a method for forming a protective layer over copper filled semiconductor features to avoid copper oxidation.

BACKGROUND OF THE INVENTION

Copper metallization is increasingly being used for advanced product integrated circuit fabrication including semiconductor features from sub-micron high aspect ratio interconnect features to larger features such as bonding pads. Copper and its alloys have lower resistivity and better electromigration resistance compared to other metals such as, for example, aluminum. These characteristics are critical for achieving higher current densities with increased device speed. While several processing difficulties related to forming copper semiconductor features have been overcome, several problems remain especially in back-end-of-line (BEOL) manufacturing processes. BEOL processes have traditionally addressed the problems of surface contaminants that adversely affect adhesion of overlying layers, contact formation, and chemical mechanical polishing (CMP).

One exemplary process for forming a multiple level semiconductor device includes, for example, is a dual damascene process. Although there are several different manufacturing methods for manufacturing dual damascene structures, all such methods employ at least two photolithographic masking and anisotropic etching steps, for example, first forming vias to electrically interconnect different levels followed by the formation of an overlying trench at least partially encompassing one or more vias to provide electrical interconnection between multiple device levels and within a device level. In most devices, pluralities of vias are separated from one another along the semiconductor wafer and selectively interconnect conductive regions between layers of a multi layer device. Metal interconnect lines or trench lines typically serve to selectively interconnect conductive regions within a layer of a multilayer device. Dual damascene formation is a process whereby via openings and trench line openings are formed in a dielectric insulating layer to form a dual damascene structure followed by a metal deposition process to fill the dual damascene structure to form the necessary electrical connections.

In forming a copper semiconductor feature, typically a relatively pure (undoped) copper material is deposited to fill an anisotropically etched opening, for example a dual damascene structure. Copper electro-chemical plating (ECP) is a preferable method for depositing copper to achieve superior step coverage of sub-micron etched features. ECP generally includes depositing a copper seed layer over the barrier layer and then electroplating bulk copper over the seed layer to fill the etched feature to form, for example, vias and trench lines. The deposited copper layer is then planarized to remove excess copper overlying the feature level by chemical mechanical polishing (CMP).

One problem affecting BEOL processes in copper metallization is the tendency of copper to easily form oxides of copper, for example (CuO or $CuO_2$) upon exposure to oxidizing environments including humid environments. Since ECP deposited bulk polycrystalline copper includes a network of grain boundaries running through the bulk of the copper filled feature, oxidation is particularly harmful to ECP deposited copper since copper oxide formation will tend to penetrate into the bulk of the copper through grain boundaries. As a result, it has become essential to carry out a post ECP copper CMP process as soon as possible following the ECP copper deposition to avoid copper oxide induced degradation of the copper features. For example, the formation of copper oxide within the bulk of the copper along the grain boundaries has a severely detrimental effect on the electrical resistance and electromigration resistance of the copper feature adversely affecting wafer yield and reliability.

In addition, the necessity of carrying out the post ECP CMP process prior to significant copper oxide formation places costly restraints on manufacturing processes, limiting a wafer throughput due to available manufacturing resources.

Yet other problems related to copper oxide formation includes reduced adhesion of copper to adjacent layers within the feature such as a barrier layer and contributes to copper hillock formation (surface protrusions) during subsequent thermal processes.

These and other shortcomings in copper feature manufacturing processes demonstrate a need in the semiconductor processing art to develop a method for forming multiple layer devices including copper metallization where copper oxidation is avoided between manufacturing processes thereby improving device performance and improving a manufacturing process.

It is therefore an object of the invention to provide a method for forming multiple layer devices including copper metallization where copper oxidation is avoided between manufacturing processes thereby improving device performance and improving a manufacturing process.

SUMMARY OF THE INVENTION

To achieve the foregoing and other objects, and in accordance with the purposes of the present invention, as embodied and broadly described herein, the present invention provides a method of forming a protective layer over a metal filled semiconductor feature to prevent metal oxidation.

In a first embodiment, the method includes providing a semiconductor process wafer comprising an insulating dielectric layer having an opening for forming a semiconductor feature; blanket depositing a metal layer over the opening to substantially fill the opening; and, blanket depositing a protective layer comprising at least one of a oxidation resistant metal and metal nitride over the metal layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a dual damascene structure including copper filled vias and trench lines it will be understood that the method of the present invention is applicable to any metal filled semiconductor feature where a protective layer may be added to prevent oxidation of the metal between manufacturing processes. In addition, it will be appreciated that the protective layer of the present invention may be applied to any sized copper filled semiconductor feature including relative wider dimensioned features such as bonding pads as well as relatively smaller dimensioned features such as vias and trench lines. Further the term 'copper' will be understood to include copper or its alloys.

In a first embodiment of the invention, a semiconductor wafer including an exposed copper surface is provided. A protective layer is deposited over the exposed copper surface to prevent oxidation of the copper surface.

In one embodiment, the exposed copper surface is formed by and electrochemical plating (ECP) process and the protective layer is formed prior to a subsequent copper CMP process to prevent the formation of copper oxides both on an exposed copper surface and within the copper bulk including along grain boundaries. Preferably the protective layer is formed soon after the ECP process prior to exposure to an oxidizing atmosphere for a period of time sufficient to form a substantial degree of copper oxide on the exposed copper surface, for example, prior to formation of a copper oxide surface layer having a thickness greater than about 10 Angstroms, more preferably prior to formation any copper oxide layer.

In one embodiment the protective layer is formed of at least one layer including at least one of a refractory metal and refractory metal nitride. In another embodiment, the protective layer is formed of at least one layer of a dielectric nitride including for example, silicon nitride (e.g., $Si_3N_4$) and silicon oxynitride (e.g., SiON).

Figure 1A:
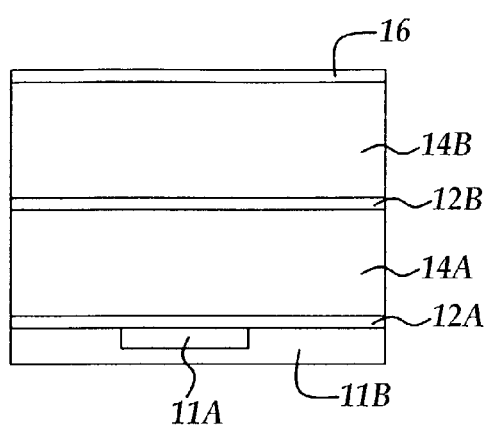
FIGS. 1A to 1F are cross-sectional views of a portion of a multilayer semiconductor device at stages in a manufacturing process according to an exemplary embodiment of the present invention.

For example, in an exemplary embodiment, referring to FIGS. 1A–1F, are shown cross sectional side views of a portion of a multi-level semiconductor device at stages in a dual damascene manufacturing process. Referring to FIG. 1A is shown a conductive region 11A, for example, a copper line, formed in a dielectric insulating layer 11B having an overlying first etching stop layer 12A, for example, silicon nitride (e.g., SiN, $Si_3N_4$). First etching stop layer 12A is formed by a conventional chemical vapor deposition (CVD) process including for example, LPCVD (low pressure CVD), having a thickness of about 300 Angstroms to about 700 Angstroms.

Still referring to FIG. 1A, formed over etching stop layer 12A is first dielectric insulating layer 14A, also referred to as an inter-metal dielectric (IMD) layer formed of, for example, fluorinated silicate glass (FSG) or a low-k (low dielectric constant) silicon oxide based material, e.g., carbon doped silicon dioxide, preferably having a dielectric constant of less than about 3.5. Typically, the first IMD layer is formed having a thickness of about 3000 to about 7000 Angstroms.

Still referring to FIG. 1A, following deposition of the first IMD layer 14A, a second etching stop layer 12B is formed in a similar manner to first etching stop layer 12A, formed of, for example, silicon nitride (e.g., SiN, $Si_3N_4$) by an LPCVD process, having a thickness of about 300 Angstroms to about 600 Angstroms. Formed over second etching stop layer 12B is a second IMD layer 14B, also formed of, for example, fluorinated silicate glass (FSG) or a low-k (low dielectric constant) silicon oxide based material, e.g., carbon doped silicon dioxide, preferably having a dielectric constant of less than about 3.5. Typically, the second IMD layer 14B is formed having a thickness about the same or slightly less than the first IMD layer 14A. Formed over the second IMD layer 14B is a third etching stop layer 16, formed of silicon nitride similar to previously formed etching stop layers and including an optional overlying bottom anti-reflectance coating (BARC) layer (not shown) to reduce undesired light reflections from the second IMD layer surface during a photolithographic patterning process. For example, the etching stop layer 16 is formed of silicon oxynitride (e.g., SiON) in an LPCVD process to fill both the functions of an etching stop and BARC layer having a thickness of about 1000 to about 1400 Angstroms.

Figure 1B:
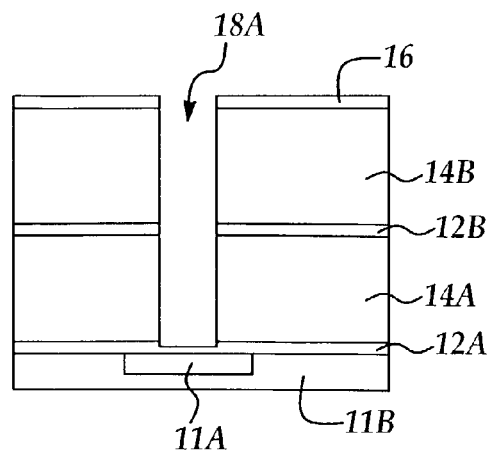
Figure 1C:
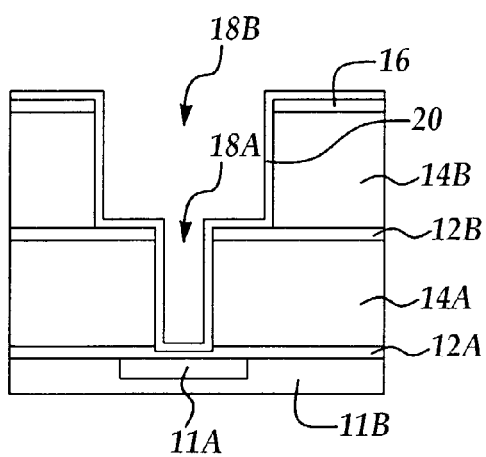

Referring now to FIG. 1B, a via etching pattern is first formed according to a conventional photolithographic patterning process followed by a conventional reactive ion etching (RIE) step to form via opening 18A. Referring to FIG. 1C, a second conventional photolithographic patterning process is then carried out followed by a second conventional reactive ion etching (RIE) process to form trench portion 18B overlying and encompassing via opening 18A to form a dual damascene structure.

Still referring to FIG. 1C, following formation of the dual damascene structure, a barrier layer 20, for example tantalum nitride (e.g., TaN) is blanket deposited to line the dual damascene structure. A copper seed layer (not shown) is then deposited by a PVD or CVD process to form a continuous copper layer to form an electroplating surface.

Figure 1D:
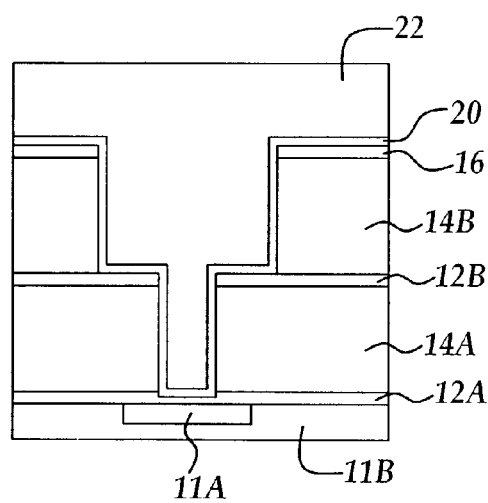

Referring now to FIG. 1D, a conventional ECP process is then carried out to fill the dual damascene structure (feature) with copper layer 22 including a portion overlying the feature level above the barrier layer 20. The copper layer portion overlying the feature level is about 3000 Angstroms to about 5000 Angstroms thick.

Figure 1E:
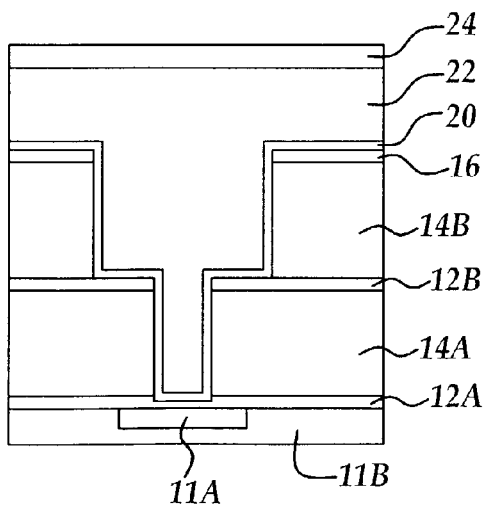
Figure 1F:
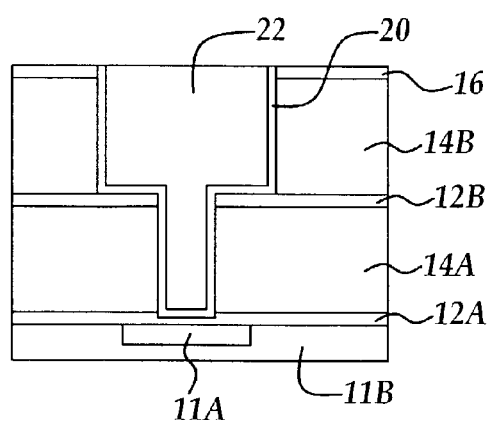

Referring to FIG. 1E, according to an embodiment of the invention a protective layer 24 is deposited to cover the exposed copper layer 22. For example, the deposition process is an LPCVD process to deposit a nitride material. In another embodiment, a PVD process may be used to first deposit an oxidation resistant metal layer, for example a refractory metal followed by a CVD process depositing an overlying metal nitride layer. In one embodiment, the protective layer 24 includes at least one of a refractory metal and refractory metal nitride. For example, the refractory metal may include one or multiple layers of tantalum, titanium, and tungsten. In another embodiment, the protective layer 24 includes a first layer of refractory metal followed by formation of an overlayer of a metal nitride of the same or another refractory metal, for example tantalum nitride, tungsten nitride, and titanium nitride. The refractory metal nitride may be deposited separately by a conventional PVD process or be formed by a nitridation process as is known in the art. The total thickness of the protective layer 24 is preferably from about 50 to about 1000 Angstroms in order to optimize a subsequent CMP process to remove it prior to copper CMP. For example it has been found that the metal nitride layer improves a subsequent CMP process by reducing dishing. It will be appreciated that thicker layers may be deposited but are unnecessary to realize the advantages of the invention.

The refractory metal or refractory metal/nitride combination is preferred due to superior resistance to oxygen diffusion and optimized CMP methods existing for refractory metal nitrides such as, for example tantalum nitride. In another, less preferred embodiment, the protective layer is formed of a nitride such as silicon nitride (e.g., $Si_3N_4$) or silicon oxynitride (SiON) by a conventional deposition process such as LPCVD.

Following formation of the protective layer 24 the process wafer in a semiconductor process may be stored prior to performing a subsequent copper CMP process. Thus, an advantage of the invention is an improvement in process manufacturing scheduling and consequent cost reductions by increasing a wafer throughput without being limited by the time requirement of performing the subsequent copper CMP process before significant copper oxidation occurs.

Referring to FIG. 1E a subsequent CMP process is performed to remove the protective layer and excess copper overlying the feature level. It will be appreciated that in the subsequent CMP process either a conventional copper polishing slurry may be used or a multiple step CMP process may be used with a different slurry used to remove the protective layer. It will further be appreciated that a multiple step CMP process may be used to first remove the excess copper layer overlying the barrier layer 20 followed by a separate CMP process to remove the barrier layer 20, for example, using a slurry and polishing pad optimized for removal of the barrier layer. It will be appreciated that additional underlying dielectric layers, for example etch stop/ARC layer may be partially or fully removed in the subsequent CMP process.

Another advantage of forming the protective barrier is the improved polishing of the copper by reducing copper dishing during the polishing process. It is believed the slower polishing rate of the protective layer for an initial period of time improves the subsequent copper CMP polishing process. Yet another advantage of forming the protective layer is that during the subsequent copper CMP process copper oxide contaminants are not transferred to the CMP process. For example, the copper oxides that form by exposure to an oxidizing environment, are typically formed of (CuO and $CuO_2$) which are harder and more abrasive than copper hydroxide $(Cu(OH)_2)$ which forms during the copper CMP process. As a result, by preventing the formation of the more abrasive form of copper oxides prevent scratches from the transferred copper oxide contamination in the subsequent CMP process thereby improving the subsequent CMP process.

Figure 2:
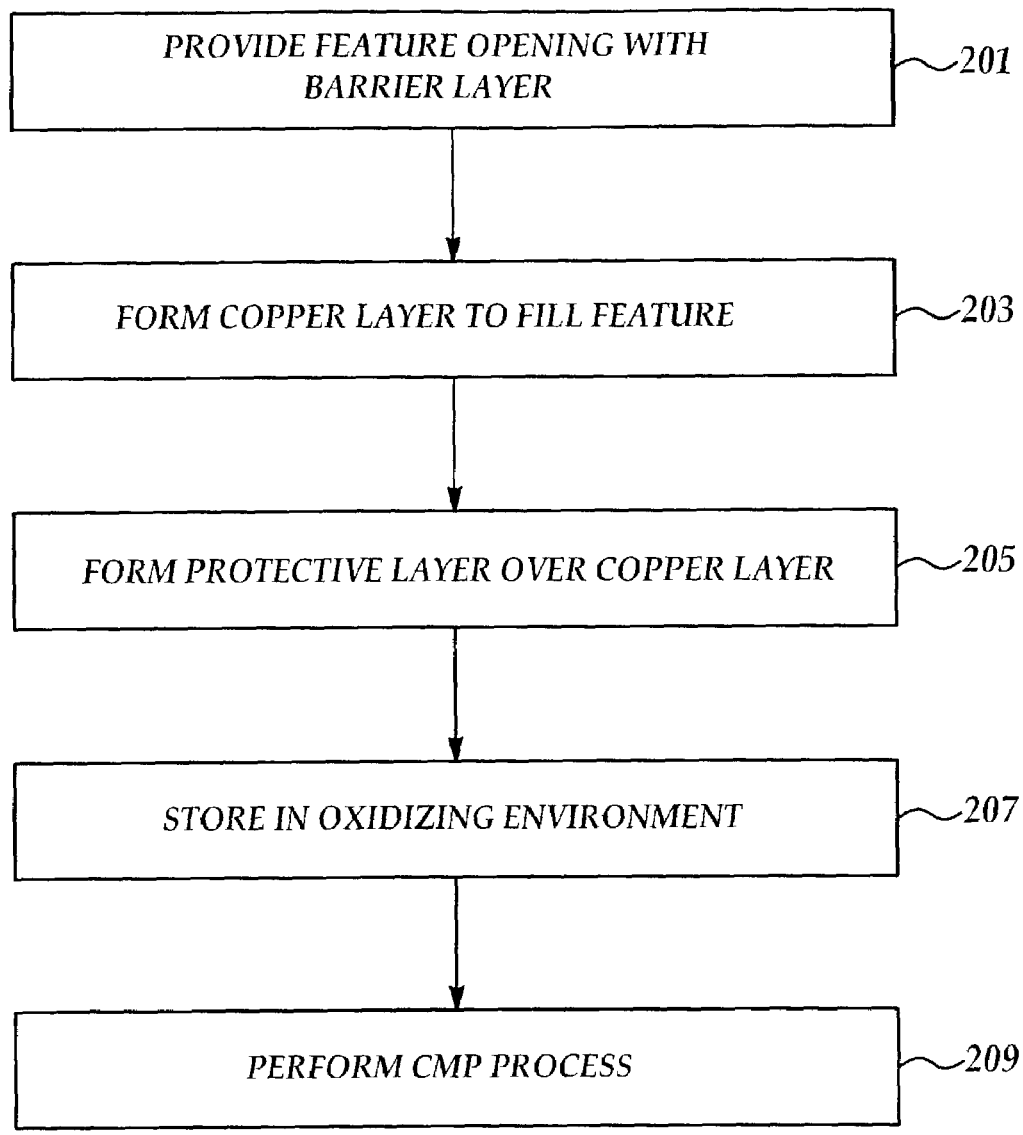
FIG. 2 is a process flow diagram according to an embodiment of the present invention.

Referring to FIG. 2 is a process flow diagram including several embodiments of the present invention. In process 201, a semiconductor process wafer including a feature opening lined with a blanket deposited barrier layer is provided. In process 203 a copper layer is formed to fill the feature opening, for example an ECP process is used to form a copper layer. In process 205 a protective layer is formed over the copper layer preferably including at least one layer of one of a refractory metal and refractory metal nitride, but optionally a metal nitride. In process 207, the process wafer is stored prior to a subsequent copper CMP process. In process 209, a CMP process is performed on the process wafer to remove the protective layer and excess copper overlying the feature level including optionally removing underlying dielectric layers including a barrier layer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a protective layer over a copper filled semiconductor feature to prevent copper oxidation comprising the steps of:
   providing a semiconductor process wafer comprising an insulating dielectric layer comprising an opening extending through a thickness thereof for forming a semiconductor feature;
   depositing a copper layer according to an electro-chemical deposition (ECD) process over the opening to substantially fill the opening;
   blanket depositing at least one protective layer comprising an uppermost nitride layer over the copper layer prior to substantial oxidation of the copper layer;
   carrying out at least a first CMP process to remove the protective layer; and
   wherein the at least one protective layer comprises a first lower layer of a refractory metal and an upper layer of a refractory metal nitride.

2. The method of claim 1, wherein the at least one protective layer is selected from the group consisting of tantalum, tungsten, titanium, and nitrides thereof.

3. A method of forming a protective layer over a copper filled semiconductor feature to prevent copper oxidation and improve a subsequent CMP process comprising the steps of:
   providing a semiconductor process wafer comprising an insulating dielectric layer comprising an uppermost etch stop layer and an opening lined with a barrier layer extending through a thickness of said insulating dielectric layer for forming a copper filled semiconductor feature;
   depositing a copper layer according to an electro-chemical deposition (ECD) process over the opening to substantially fill the opening;
   blanket depositing at least one protective layer comprising an uppermost nitride layer over the copper layer to prevent formation of a copper oxide layer;
   carrying out a first CMP process to remove the at least one protective layer;
   carrying out at least a second CMP process to remove the copper layer and baffler layer above the etch stop layer; and
   wherein the at least one protective layer comprises a lowermost refractory metal layer and an overlying refractory metal nitride layer.

4. A method of forming a protective layer over a copper filled semiconductor feature to prevent copper oxidation comprising the steps of:
   providing a semiconductor process wafer comprising an insulating dielectric layer comprising an opening extending through a thickness thereof for forming a semiconductor feature;
   depositing a copper layer according to an electro-chemical deposition (ECD) process over the opening to substantially fill the opening;
   blanket depositing at least one protective layer comprising an uppermost nitride layer over the copper layer prior to substantial oxidation of the copper layer;
   carrying out at least a first CMP process to remove the protective layer; and
   wherein the at least one protective layer comprises a first lower layer of tantalum and an upper layer of TaSiN.

5. A method of forming a protective layer over a copper filled semiconductor feature to prevent copper oxidation and improve a subsequent CMP process comprising the steps of:
   providing a semiconductor process wafer comprising an insulating dielectric layer comprising an uppermost etch stop layer and an opening lined with a baffler layer extending through a thickness of said insulating dielectric layer for forming a copper filled semiconductor feature;

depositing a copper layer according to an electro-chemical deposition (ECD) process over the opening to substantially fill the opening;

blanket depositing at least one protective layer comprising an uppermost nitride layer over the copper layer to prevent formation of a copper oxide layer;

carrying out a first CMP process to remove the at least one protective layer;

carrying out at least a second CMP process to remove the copper layer and barrier layer above the etch stop layer; and wherein the at least one protective layer comprises a first lower layer of tantalum and an upper layer of TaSiN.

* * * * *